(12) United States Patent
Schmidt

(10) Patent No.: US 6,946,390 B2
(45) Date of Patent: Sep. 20, 2005

(54) PHOTOLITHOGRAPHIC PRODUCTION OF TRENCHES IN A SUBSTRATE

(75) Inventor: Markus Schmidt, Seibersbach (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/614,545

(22) Filed: Jul. 7, 2003

(65) Prior Publication Data

US 2004/0132290 A1 Jul. 8, 2004

(30) Foreign Application Priority Data

Jan. 8, 2001 (EP) ............................................. 01100436

(51) Int. Cl.⁷ ........................................ H01L 21/4763
(52) U.S. Cl. ........................ 438/637; 438/689; 438/672; 438/700
(58) Field of Search ............................... 438/685–688, 438/675, 672, 637

(56) References Cited

U.S. PATENT DOCUMENTS

| | | | |
|---|---|---|---|
| 4,707,218 A | | 11/1987 | Giammarco et al. |
| 4,931,137 A | * | 6/1990 | Sibuet .......................... 216/13 |
| 5,246,879 A | | 9/1993 | Hsu et al. |
| 5,837,426 A | | 11/1998 | Tseng et al. |
| 5,895,740 A | | 4/1999 | Chien et al. |
| 6,042,993 A | | 3/2000 | Leuschner et al. |
| 6,187,684 B1 | * | 2/2001 | Farber et al. ................ 438/704 |
| 6,566,280 B1 | * | 5/2003 | Meagley et al. ............. 438/780 |
| 2003/0203508 A1 | * | 10/2003 | Yates et al. ...................... 438/1 |

FOREIGN PATENT DOCUMENTS

| | | |
|---|---|---|
| EP | 1045291 A3 | 1/2001 |
| JP | 02257624 A2 | 10/1990 |

OTHER PUBLICATIONS

MicroElectronc Engineering, "Sensitivity–Enhanced Dry Development Process for VUV and EUV Lithography Using Graft–Polymerization", 1996, pp. 287–290.

\* cited by examiner

Primary Examiner—Thanh Nguyen
(74) Attorney, Agent, or Firm—Lisa J. Ulrich

(57) ABSTRACT

A method for the manufacture of micro metallic structures having high aspect ratios is provided, wherein said method comprises the step of photolithographically producing trenches in a substrate. Polymer chains are formed on the inner surface of said trenches. Thus, the critical dimensions in the photolithographical process can be reduced to any dimension down to zero. The method is quite general in its application to any process that includes the definition of a critical dimension by photolithography. Immediate applications are the reduction of the read and write dimensions in thin film magnetic heads, but the invention can be used in any technology where the manufacture of microstructures having a high aspect ratio is of interest.

11 Claims, 7 Drawing Sheets

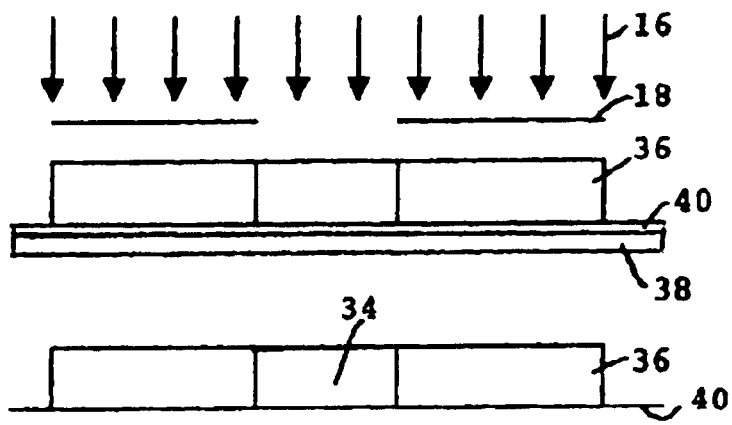
FIG. 2A
FIG. 2B
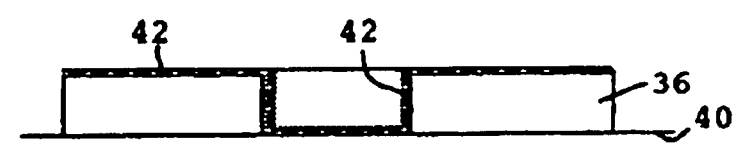
FIG. 2C
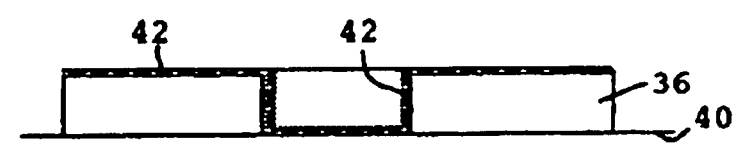
FIG. 2D
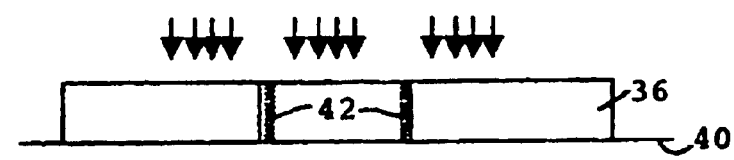
FIG. 2E
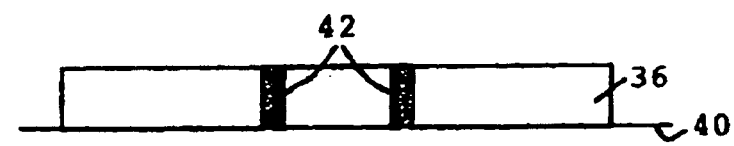
FIG. 2F
FIG. 2G
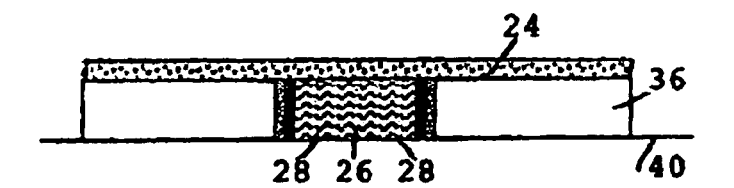
FIG. 2H

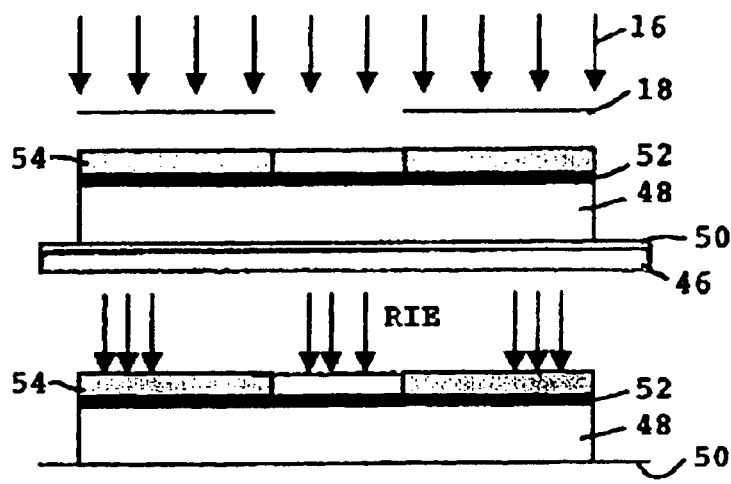
FIG. 3A
FIG. 3B
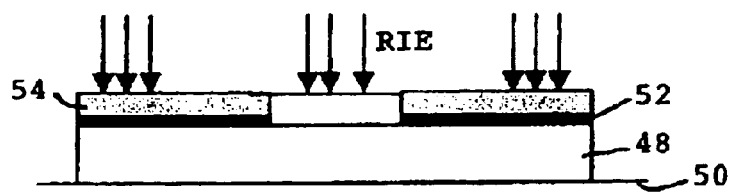
FIG. 3C
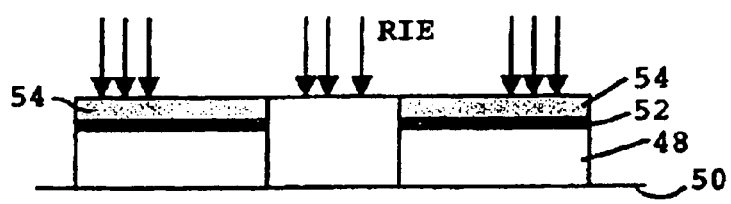
FIG. 3D
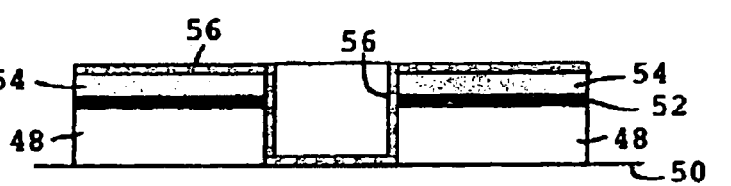
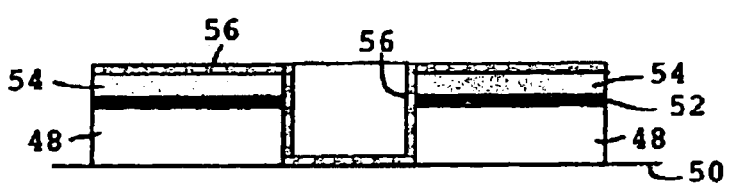
FIG. 3E
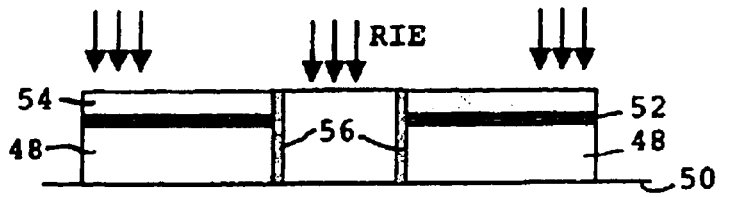
FIG. 3F
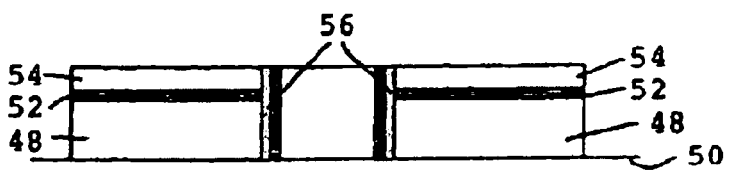
FIG. 3G

PHOTOLITHOGRAPHIC PRODUCTION OF TRENCHES IN A SUBSTRATE

FIELD OF THE INVENTION

The present invention relates in general to photolithographic processes. Specifically, the present invention is concerned with a process for the manufacture of metallic structures comprising the step of photolithographically producing trenches in a substrate.

BACKGROUND OF THE INVENTION

In semiconductor technology and in microelectronics, the dimensions of structures are becoming smaller and smaller. In memory production today, e.g., structures with a width of less than 400 nm are produced using optical lithography in combination with the masking technique. Photolithographic processes are vital steps in the fabrication of, e.g., semiconductor devices. In a photolithographic process, an exposure light, usually ultraviolet (UV) light is used to expose a photoresist-coated semiconductor wafer through a mask (in the following called photomask). The purpose of the photolithographic process is to transfer a set of patterns representative of the circuit layer onto the wafer. The patterns on the photomask define the positions, shapes and sizes of various circuit elements such as diffusion areas, metal contacts and metallization layers, on the wafer.

In optical lithography a limit can be expected at approximately 150 nm because of diffraction effects.

However, structures with even smaller dimensions are required for new applications such as single-electron transistors or molecular electronic components. In the case of very high-frequency circuits this is also true in conventional electronics. There is also a need to reduce, e.g., the read and write dimensions in thin film magnetic heads. In addition to that, micro structures having a very high aspect ratio of about 5 to 30 and greater will be needed.

Today's photolithographical techniques are still restricted by the wavelength of the used exposure light to arrive at critical dimensions as small as possible. Reduction of the critical dimensions was done in most cases by the reduction of the wavelength of radiation, i.e., starting with UV exposure and proceeding to DUV exposure, electron radiation and X-rays. X-ray lithography, e.g., makes it possible to image dimensions of less than 100 nm. In electron and ion beam lithography, structures as small as 10 nm can be generated with high-energy particles. However, this requires expensive vacuum systems and beam guidance systems. In addition, problems can occur with sensitive components due to radiation damage in the substrate, because the high-energy particles can penetrate through the resist layers required for etching processes.

U.S. Pat. No. 5,837,426 discloses a photolithographic process which provides reduced line widths or reduced inter-element line spaces for the circuit elements on an IC chip, allowing the IC chip to have a higher degree of integration. This photolithographic process includes a double-exposure process on the same wafer defined by placing either the same photomask at two different positions or by using two photomasks.

In U.S. Pat. No. 6,042,993 a photolithographic structure generation process for structures in the sub-200 nm range is disclosed wherein a layer of amorphous hydrogen-containing carbon with an optical energy gap of <1 eV or a layer of sputtered amorphous carbon is applied as the bottom resist to a substrate; the bottom layer resist is provided with a layer of an electron beam-sensitive silicon-containing or silylatable photoresist as the top resist; the top resist is then structured by means of scanning tunneling microscopy (STM) or scanning force microscopy (SFM) with electrons of an energy of <80 eV; and the structure is subsequently transferred to the bottom resist by etching with an anisotropic oxygen plasma and is next transferred to the substrate by plasma etching.

However, there is still a need to produce coating thicknesses from some nm into the $\mu$m range.

SUMMARY OF THE INVENTION

It is therefore an object of the present invention to provide a method for the reduction of the widths of photolithographically produced trench structures below the diffraction limit.

It is a further object of the invention to provide such structures having a very high aspect ratio.

It is still a further object of the present invention to provide such a process that can be easily integrated into existing photolithographic procedures.

These and other objects and advantages are achieved by the method disclosed in claim 1.

Advantageous embodiments of the invention are disclosed in the dependent claims.

BRIEF DESCRIPTION OF THE DRAWINGS

FIGS. 2A–2I and 2K–2O schematically shows the process steps of a process according to a second embodiment of the invention;

FIGS. 3A–3I and 3K–3O schematically depicts the process steps of a process according to a third embodiment of the invention;

DETAILED DESCRIPTION OF THE PREFERRED EMBODIMENT

Figure 1A:
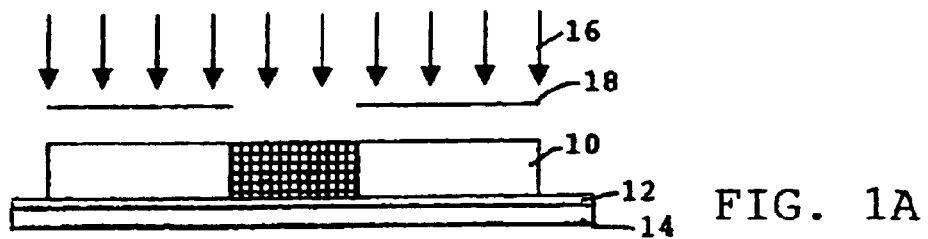
FIGS. 1A–1I schematically depicts the process steps of a process according to one embodiment of the invention.

Lithography processes are typically used for semiconductor fabrication, for example to form a mask over a layer to be patterned in accordance with various functional and/or design requirements for fabricating a desired semiconductor device.

For a typical lithography process, photoresist is deposited over the layer to be patterned and is exposed to ultraviolet radiation through a mask that defines the pattern to be formed in the photoresist. The photoresist is then developed to form a patterned photoresist layer over the underlying layer to be patterned. Those portions of the underlying layer that are not covered by photoresist may then be etched using suitable etch techniques and chemistries. The pattern in the photoresist is thus replicated in the underlying layer.

Typical lithography processes, however, limit the size and density with which semiconductor devices may be fabricated. For example, the minimum resolution capability of the lithography process determines the minimal pitch with which features for a patterned layer may be printed. The minimum lithographic resolution for a patterning process may depend, for example, on the lens used in exposing photoresist to radiation through the mask.

The present invention exploits the concept of polymer grafting to reduce the width of photolithographically produced trenches below the image limit and to increase the aspect ratio of such trenches and, in turn, of metallic structures produced therein. Polymer grafting is the definition for polymerizations where graft polymers are formed. In grafting to "methods, a pre-built polymer is fixed to the surface, whereas in grafting from" methods a polymerization reaction is initiated from the surface and the polymer is formed in situ. In the following, only "grafting from" techniques will be described. Grafting to is also possible but limited by the diffusional behaviour of the preformed polymer chains of the absorbant chains. In this case a polymer with functional headgroup that is compatible to the surface will be coated over the preformed resist structure (see below). The adsorption process will take place, leaving the resist surface with chemically bonded polymer and effectively reducing the preformed critical dimension of the photoresist structure.

The polymerization can be controlled so that layer thicknesses of a few nm up to $\mu$m can be applied. Thus, there is no lower limit with respect to the inner width produced and no upper limit with respect to the achievable aspect ratio, respectively.

Using the method acccording to the invention, it is possible to produce structures by means of low resolution photholithographic devices that normally will only be achievable using devices of the next generation.

The described method is especially useful for thin film head technology, however, it is is not restricted thereto but can be used in any technology where the manufacture of microstructures having a high aspect ratio is of interest.

The method according to the invention can easily be incorporated into conventional lithographic processes. The additional steps with respect to standard photolithography are the adsorption of a polymerization initiator on the vertical surfaces of the trench structure and the start of the polymerization process to the appropriate thickness of the polymeric layer, the so called polymer brushes.

In the following, four different processes will be described using method steps according to the present invention to reduce the width of photolithographically produced trench structures in a photoresist. However, the invention is not restricted to these examples, since the skilled worker may think of different other process sequences using the present invention.

Method 1

FIGS. 1A–1I schematically depicts the process steps of a process according to one embodiment of the invention, the prerequisite being that the photoresist used and the low molecular material (starter molecule) necessary for the production of the polymer brushes have compatible chemical characteristics, so that the low molecular material can be chemically bonded to the resist.

Figure 1B:
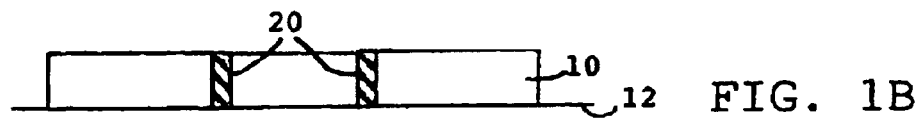

First of all, a trench is produced using, e.g., a standard P(t-BOC)styrene based photostructure. A photoresist 10 is applied to a seed layer 12 on a substrate 14, subsequently the resist 10 is exposed to radiation 16 using a mask 18 and baked (FIG. 1A). Following the baking process, the resist 10 is developed (FIG. 1B).

In order for the functional groups of the starter molecule to be able to chemically bond to the vertical surfaces of the photoresist thus produced, it is necessary that a sufficient amount of anchor points is present on this surface or wall. Every compound that is able to start radical polymerization can be used as a starter molecule. Condensation, however, is also a possible reaction way. Functional groups can be any group that chemically bonds or delivers a high enough binding energy to form an anchor site. Examples are a) silanes/oxidic surface, b) thiols/gold, or c) copolymers that mix into the photoresist surface and contain the starter.

Thus, for azomonochlorosilane (AMCS) as a starter molecule, a suitable amount of OH-groups must be present. This is the case, e.g., for some photoresists used for deep UV. After exposure of such resists to deep UV radiation, a region 20 having an increased amount of OH-groups is present on the vertical surfaces of the photoresist 10.

Figure 1C:
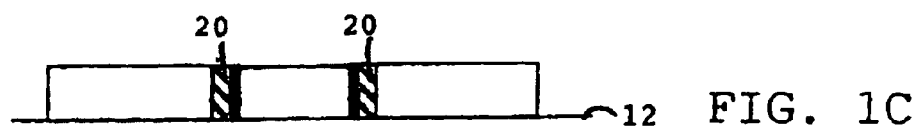
Figure 1D:
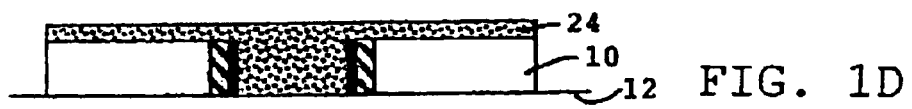
Figure 1E:
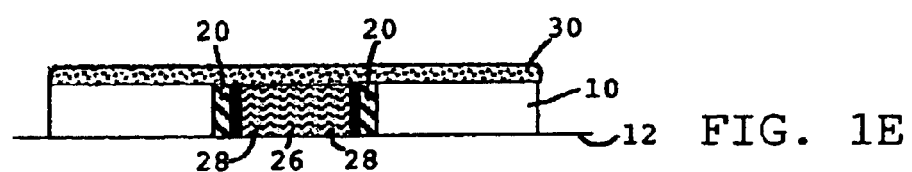
Figure 1F:
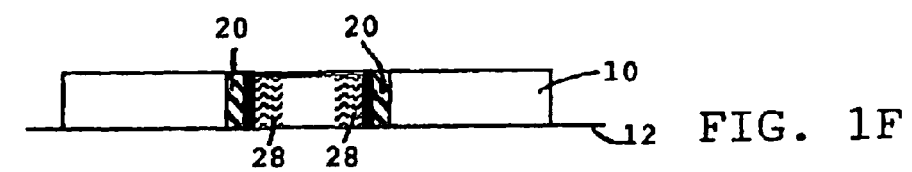
Figure 1G:
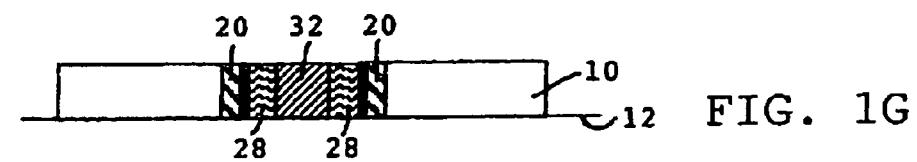
Figure 1H:
Figure 1I:

Next, the structure thus produced is brought in contact with the starter molecule AMCS in a rinsing step. Chemisorption of the starter molecule at the OH-groups 20 will take place and silanol compounds will form, building up a monolayer 22 (FIG. 1C). The reaction is performed at room temperature.

Following the coating with the starter molecule, a suitable monomer 24, like, e.g., polystyrene (PS), polyethylene (PE), polymethylmethacrylate (PMMA) or polytetrafluoroethylene (PTFE), is applied (FIG. 1D) and the structure is subsequently brought into a polymerization reactor (not shown) being able to perform a radical polymerization. The reactor is needed to maintain clean conditions and to not allow contact to the environment gases that may contain $O_2$. Standard technologies for polymerization are applicable.

When starting the polymerization by heating to about 60° C. or by exposing the structure to UV radiation, a free polymer chain 26 as well as polymer chains 28 being bonded to the vertical sidewalls are produced. The free polymer chains 26 will form in the vicinity of the starter molecule and will be entangled with the bonded chains (28). A layer 30 of free monomer will remain on top of the structure (FIG. 1E) since there is no starter around to react with.

The degree of polymerizaton can be controlled by the decay characteristics of the starter molecule. The photochemistry of AMCS is statistical. Depending on photon flux and time of exposure, a certain number of AMCS molecules will have decayed and initiated a polymer chain. The number of decayed starter sites will transform into the conformation of the bound polymer and then into a certain coating thickness that is related to the amount of decayed starter sites. Thus, the layer thickness of the added polymer can be adjusted.

After the polymerization is complete, the free polymer, i.e., the polymer not bonded to the vertical sidewalls of the structure, has to be removed by means of a suitable solvent, i.e., a solvent that will be able to remove only the free polymer chain 26, letting intact the polymer chains 28 bonded to the vertical sidewalls, now forming the polymer brushes, which will decrease the surface roughness. Thus, as can be seen in FIG. 4, the width $d_1$ of the trench structure produced in the photoresist layer is reduced by the thickness of the polymer brushes on the vertical sidewalls of the photoresist to a value of $d_2$.

Subsequently, the manufacture of the micro metallic structure is continued by known process steps such as electroplating, ion implanting, etc. Removal of the photoresist structure is done by a conventional standard stripping process, using, e.g., NMP as a solvent. After removal of the seed layer 12, the micro metallic structure 32 will remain, having a higher aspect ratio than a similar structure formed without forming the polymer brushes 28 due to the reduced width $d_2$ of the trench.

It has to be noted that the present invention is not restricted to the manufacture of micro metallic structures, but can also be used, e.g., when forming via holes and the like in semiconductor industry.

Method 2

Figure 2I:
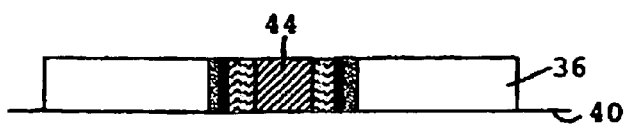
Figure 2K:
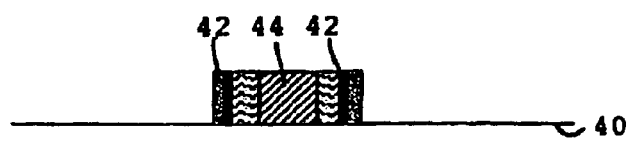
Figure 2L:
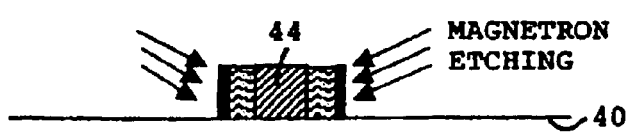
Figure 2M:
Figure 2N:
Figure 2O:

In FIGS. 2A to 2O, there are shown the process steps of a process according to a second embodiment of the invention.

This process is independent of the characteristics of the photoresist used because of the further step of applying an additional oxide layer which is compatible with the chemistry of the starter molecule. This has the advantage that the process is totally independent from the resist used. If there exist doubts whether the process can be implemented with the chosen resist material, this method can be of interest.

As can be seen in FIGS. 2A and 2B, a trench 34 is produced in the photoresist 36 by applying the resist 36 on a substrate 38 carrying a seed layer 40, exposing the structure to radiation, baking and developing the resist. The only difference to the process shown in FIG. 1A is the fact that a standard diazonaphtoquinone (DNQ)-Novolak based photostructure is used as an example instead of a P(t-BOC) styrene based structure.

Accordingly, it is necessary to apply an additional layer 42 of an oxidic material, e.g., $SiO_x$ or $Al_2O_3$, having a chemistry which is compatible with that of the starter molecule. Depending on the functionality it may also be a thin gold film with a thiol binding. This additional layer 42 is applied on the vertical as well as on the horizontal surfaces of the structure by known methods, e.g., sputtering (FIG. 2C).

In the next step (FIG. 2D), this additional layer is removed from the horizontal surfaces of the structure by means of anisotropic etching, e.g., reactive ion etching (RIE) using, e.g., $CF_4$ as an etchant, so that the oxidic layer 42 only remains on the vertical surfaces of the structure, where the polymer is to be bonded.

The next process steps, i.e., the application of the polymer brushes, electroplating, ion implanting, etc. (FIGS. 2E to 2I), are identical to the steps performed in method 1 and shown in FIGS. 1C to 1G).

Following the plating step (FIG. 2I), the photoresist 36 is removed by a conventional NMP strip. However, this NMP stripping process may not remove the additional oxidic layer 42. In this case, the remainder is removed by means of, e.g., magnetron etching or a snowclean process, where $CO_2$ is guided versus the structure (FIG. 2L).

After removal of the seed layer 40 (FIG. 2M), the micro structure 44 will remain, having a higher aspect ratio than a similar structure formed without forming the polymer brushes due to the reduced width $d_2$ of the t rench.

Method 3

Figure 3H:
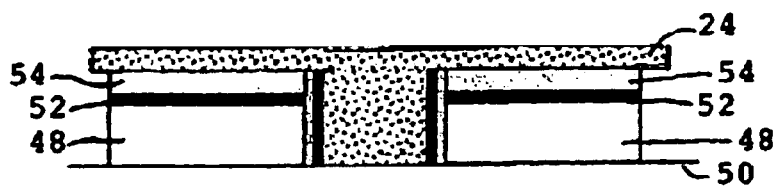
Figure 3I:
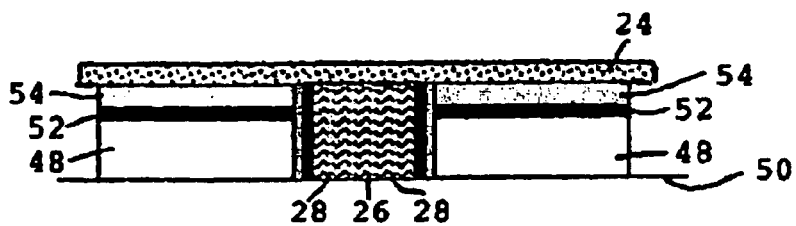
Figure 3K:
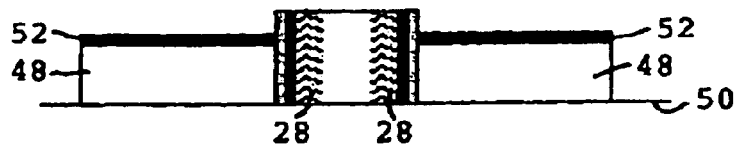
Figure 3L:
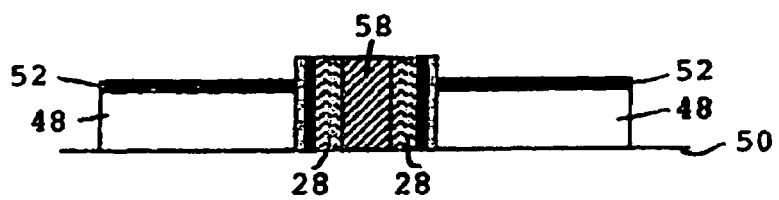
Figure 3M:
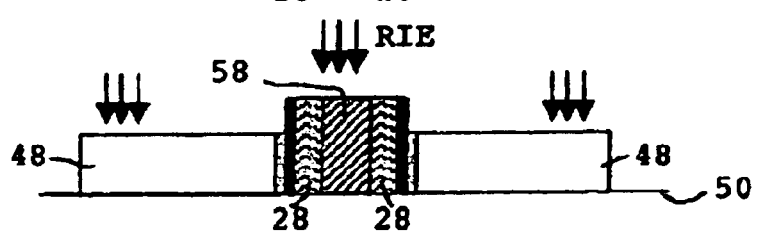
Figure 3N:
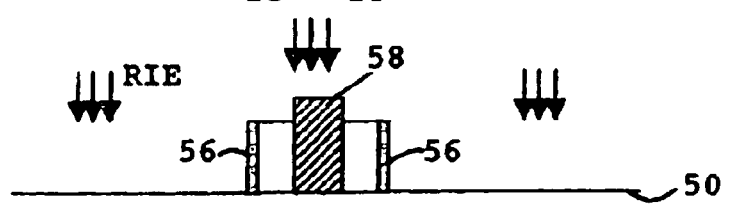
Figure 3O:
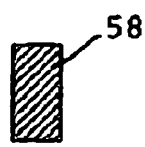

The process steps of a method according to a third embodiment of the invention are shown in FIGS. 3A to 3O.

This process describes a method for transferring a photo structure from a thin photo layer into an etch mask and the subsequent transfer of this structure into an underlying resist layer by means of RIE, the so called Image Transfer process.

First, a trilayer structure is formed on the substrate 46 (FIG. 3A), being comprised of a photoresist layer 48 (underlaying resist) formed on a seed layer 50, a hardmask 52 being comprised of metal or metal oxide, and an imaging layer 54 being comprised of a photosensitive upper resist.

After exposure to radiation and development of the resist, the structure present in the imaging layer 54 is transferred into the hardmask 52 and, subsequently, into the photoresist layer 48 by RIE (FIGS. 3B to 3D).

Next, an oxidic layer 56 is applied to the vertical and horizontal surfaces of the structure as described in method 2 above (FIG. 3E).

By means of RIE, this layer is subsequently removed from the horizontal surfaces of the structure.

Following the removal of the oxidic layer 56, formation of the polymer brushes is performed according to the steps described in methods 1 and 2 above (FIGS. 3G to 3I).

Subsequently, the free polymer is removed with a suitable solvent and the imaging layer 54 is stripped (FIG. 3K).

The formation of the final structure is performed by electroplating and ion implant, etc. as described in methods 1 and 2 (FIG. 3L).

In the next steps, the hardmask 52 and the underlying resit layer 48 are removed by RIE (FIG. 3M), either in one single step or in two separated steps.

Finally, the remaining oxidic material and the seed layer is removed by ion milling and the micro metallic structure 58 will remain, having a higher aspect ratio than a similar structure formed without forming the polymer brushes due to the reduced width $d_2$ of the trench.

Method 4

The process steps of a method according to a third embodiment of the invention are shown in FIGS. 4A to 4E.

This process describes a reduction of the width in the imaging layer by using polymer brushes according to the invention in connection with an Image Transfer process of method 3.

Figure 4A:
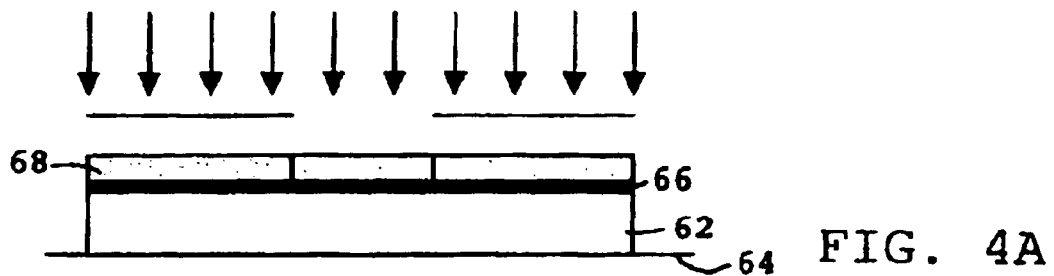
FIGS. 4A–4E schematically depicts the process steps of a process according to a fourth embodiment of the invention.

First, a trilayer structure is formed on the substrate 60, being comprised of a photoresist layer 62 (underlaying resist) formed on a seed layer 64, a hardmask 66 being comprised of metal or metal oxide, and an imaging layer 68 being comprised of a photosensitive upper resist (FIG. 4A).

Figure 4B:
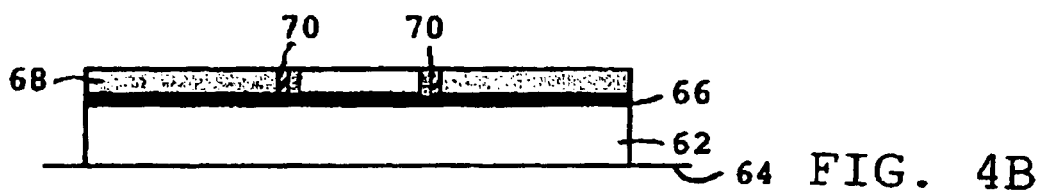
Figure 4C:
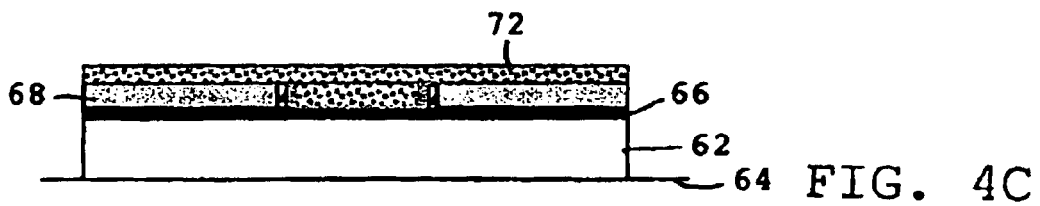

Next, the starter molecule is applied, increasing the amount of OH-groups at the side walls and forming a monolayer 70 (FIG. 4B).

Figure 4D:
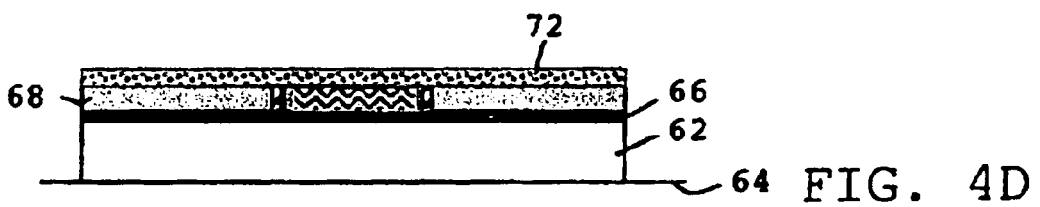

In the next step, a suitable monomer 72 is applied (FIG. 4C) and the polymerization is started (FIG. 4D).

Figure 4E:
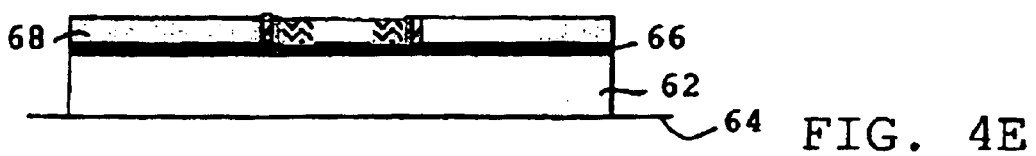
Figure 5:
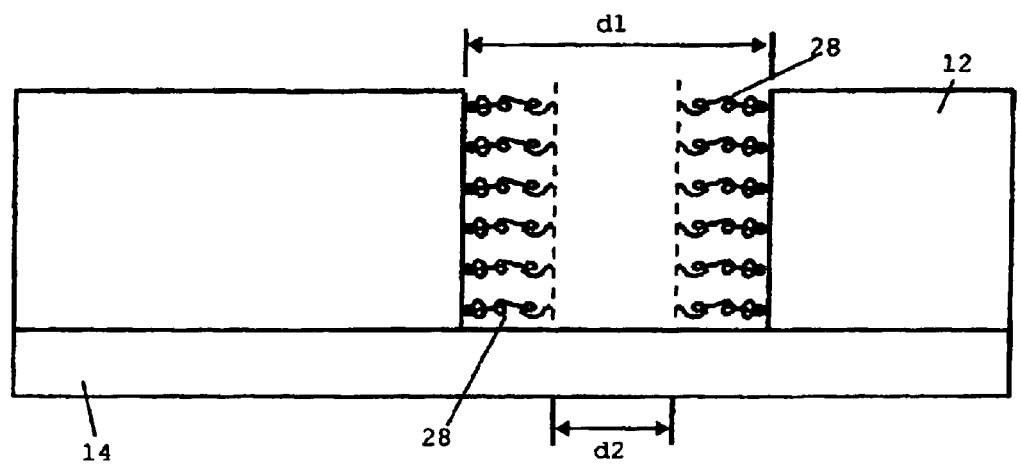
FIG. 5 schematically shows the reduced width of a trench produced according to the present invention.

After washing off the free polymer with a good solvent, the imaging layer resist 68 remains (FIG. 4E).

The following process steps are standard image transfer steps, i.e., removing the hardmask by RIE, electroplating, removing the underlying resist layer, and removing the ssed layer by sputter etching.

By the additional step of a "grafting from"-polymerization, the critical dimensions in the photolithographical process can be reduced to any dimension down to zero. That means that photolithography can be operated at a wavelength where the process cost is minimized. The method is quite general in its application to any process that includes the definition of a critical dimension by photolithography. Immediate applications are the reduction of the read and write dimensions in thin film magnetic heads, but the invention can be used in any technology where the manufacture of microstructures having a high aspect ratio is of interest.

What is claimed is:

1. The method for the manufacture of microstructures comprising the steps of:
    photolithographically producing at least one trench, said trench having at least two substantially vertical and at least one substantially vertical sides; and
    forming polymer brushes by polymer grafting techniques on the inner surface of said at least one trench, the forming comprising the steps of:
        a) absorbing a polymerization initiator on said inner surfaces; and
        b) polymerizing said inner surfaces
    wherein said polymerization initiator is capable of binding to functional OH-groups
    wherein said polymerization initiator is azomonochlorosilane.

2. The method for the production of microstructures comprising the steps of:
  photolithographically producing at least one trench, said trench having at least two substantially vertical and at least one substantially vertical sides; and
  forming polymer brushes by polymer grafting techniques on the inner surface of said at least one trench, the forming comprising the steps of:
    a) absorbing a polymerization initiator on said inner surfaces; and
    b) polymerizing said inner surfaces
  wherein said polymerization initiator is coated onto the vertical walls of said trench
    further comprising the steps of:
    a) applying a layer of a monomer;
    b) starting a polymerization process of said monomer, said polymerization process forming polymer chains, wherein at least some of said polymer chains bond to said vertical walls of said trench structure;
    c) removing said free polymer chains not bonded to said vertical walls;
    d) forming a metallic structure; and
    e) removing the remaining photoresist structure.

3. The method according to claim 2, wherein said polymer brushes are formed by a member selected from the group consisting of grafting to and grafting form techniques.

4. The method according to claim 2 further comprising an oxidic layer bonded to the at least two substantially vertical surfaces of the photoresist, said polymer chains bonded to the oxidic layer.

5. The method according to claim 2, wherein said microstructure has an aspect ratio of 5 or higher.

6. The method according to claim 2 wherein said polymerization initiator is applied in a rinsing step.

7. The method according to claim 6 wherein said photoresist is a P(t-BOC)styrene based photoresist.

8. The method according to claim 2 further comprising the steps of:
  a1) applying an oxidic layer to said vertical walls of said trench structure prior to starting the polymerization process; and
  a2) removing said oxidic layer at substantially the same time as the remaining photoresist structure in step e.

9. The method according to claim 8 wherein said photoresist is a diazonaphtoquinone (DNQ) Novolak based photoresist.

10. The method according to claim 9 wherein said oxidic layer is selected from the group consisting of silicon oxide and $Al_2O_3$.

11. The method according to claim 8 wherein said removing of the remaining photoresist structure comprises reactive ion etching (RIE).

* * * * *